United States Patent
Green et al.

[11] Patent Number: 6,162,658
[45] Date of Patent: Dec. 19, 2000

[54] METALLIZATION OF BURIED CONTACT SOLAR CELLS

[75] Inventors: Martin Andrew Green, Waverley; Stuart Ross Wenham, Menai Heights; Christiana B Honsberg, Coogee, all of Australia

[73] Assignee: Unisearch Limited, New South Wales, Australia

[21] Appl. No.: 09/062,421

[22] Filed: Apr. 17, 1998

Related U.S. Application Data

[63] Continuation of application No. PCT/AU96/00647, Oct. 14, 1996.

[51] Int. Cl.[7] .................................................. H01L 31/18
[52] U.S. Cl. ........................ 438/57; 438/98; 438/71
[58] Field of Search .................................. 438/57, 69, 71, 438/72, 96, 97, 98, 542, 546, 558, 561, 563, 700, 702, 703, 576, 665, 73; 136/256; 257/466

[56] References Cited

U.S. PATENT DOCUMENTS

| | | |
|---|---|---|
| 4,726,850 | 2/1988 | Wenham et al. .................. 136/256 |
| 4,855,017 | 8/1989 | Douglas ............................ 438/701 |
| 5,081,049 | 1/1992 | Green et al. ...................... 438/71 |

FOREIGN PATENT DOCUMENTS

| | | |
|---|---|---|
| 40395/85 | 10/1985 | Australia . |
| 61-240682 | 10/1986 | Japan . |
| 1-114042 | 5/1989 | Japan . |

*Primary Examiner*—Savitri Mulpuri
*Attorney, Agent, or Firm*—Jordan and Hamburg LLP

[57] ABSTRACT

The present invention makes use of geometry of grooves formed in a substrate, to allow a dielectric layer to be deposited with some regions of the grooves having a substantially thinner layer deposited than top surfaces of the substrate. These regions of reduced thickness dielectric within the grooves are then prematurely etched by an appropriate chemical, or other, etchant capable of controllably etching away the dielectric layer, with the result that in these regions the silicon surface can be exposed and plated by a metallization while the top surface remains protected by the dielectric material. The remaining dielectric material can optionally be required to act as an anti-reflective coating. The invention is applicable in making buried contact solar cells.

47 Claims, 7 Drawing Sheets

METALLIZATION OF BURIED CONTACT SOLAR CELLS

This is a continuation of application Ser. No. PCT/AU96/00647, filed Oct. 14, 1996.

BACKGROUND OF THE INVENTION

The achievement of high efficiencies for solar cells on large area substrates is dependent upon achieving narrow line widths and high aspect ratios (ratio of height to width) for the metallization on the surface exposed to sunlight. The buried contact solar cell [S. R. Wenham and M. A. Green, U.S. Pat. Nos. 4,726,850 and 4,748,130] provides a design for the metallization that achieves both fine line widths and high aspect ratios for the metallization while simultaneously being well suited to commercial production. However, previous implementations of the buried contact solar cell metallization scheme have required the deposition or growth of a dielectric or equivalent layer across the top surface of the substrate early in the processing sequence so as to provide masking of the top surface against diffusions, chemical etching, and metal plating. By necessity, this dielectric masking layer has had to be able to withstand the chemical etching and the high temperature processing without deterioration or excessive thinning. This has greatly limited the available choice for such dielectrics, particularly when the dielectric is then required to also act as an anti-reflection coating at the end of the process.

A typical implementation previously reported in the literature involves the formation of the dielectric layer across the top surface prior to laser scribing. The laser scribing then forms grooves through the dielectric layer and into the silicon material. A chemical etch is then used to clean and etch the grooves while the masking dielectric layer across the top surface prevents the etching solution having any impact on the top surface. A high temperature process is then used during which dopants are diffused into the exposed silicon groove walls during which again the dielectric layer masks the top surface to prevent unwanted dopants from penetrating into the silicon. In this step, clearly the dielectric masking layer must not only be able to withstand the high temperatures involved, but also be able to block the diffusion of dopants through the layer without significant degradation in thickness, chemical resistance, or optical properties. Following the groove diffusion further high temperature treatments are usually required associated with the design of the rear metal contact, following which metal plating of the front surface grooves and the rear surface metal contact are effected.

In the present invention, many of the limitations and requirements for the top surface dielectric masking layer are relaxed, while the overall processing sequence is simultaneously simplified.

SUMMARY OF THE INVNTION

According to a first aspect, the invention provides a method of processing a semiconductor substrate including the steps of forming one or more grooves in a surface of the substrate, selectively applying dielectric coating to the surface by a technique which preferentially coats the surface such that relative to the coating on the surface, the coating on the groove wall is thinner or non-existent and etching the dielectric coating until some regions of the groove walls are exposed without exposing the surface.

According to a second aspect, the present invention provides a method of processing a semiconductor substrate including the steps of forming one or more grooves in a surface of the substrate, forming undercut regions of the groove walls, applying a dielectric coating to the surface of the substrate by a line of sight deposition technique whereby deposition is thinner or non-existent in at least the undercut regions of the groove walls and etching the dielectric coating until some regions of the groove walls are exposed without exposing the top surface.

According to a third aspect, the invention provides a method of processing a semiconductor substrate having no surface texturing or having surface texturing in which surface features have a slope less than or equal to a maximum slope value, the method including the steps of forming one or more grooves in the surface of the substrate, the grooves having walls which slope more steeply than the maximum slope value of the features of the surface texturing applying a dielectric coating to the surface by a line of sight deposition technique whereby the deposition is thinner or non-existent at least in some regions of the groove walls and etching the dielectric coating until some regions of the groove walls are exposed without exposing the top surface.

According to a fourth aspect the invention provides a device manufactured using the method of the invention.

Preferably, the invention is applicable to the manufacture of silicon solar cells in which the grooves are used to form buried contacts in the cell top surface.

In preferred embodiments the top surface and the groove walls will be doped to form a rectifying junction after the grooves are formed but before the dielectric coating is formed. Preferably, the doping will be achieved in such a way that the doping level in the grooves is higher than over the remainder of the top surface. This can be achieved for example by thinning a spin on dopant with a volatile solvent such that a larger volume of the thinned dopant collects in the grooves and then gently heating the dopant to drive off the solvent before heating the substrate more strongly to drive the dopant into the surface.

The metallization is applied to the grooves in the preferred embodiment after the dielectric has been etched back to expose at least part of the groove walls.

In the case where no undercutting of the grooves is performed, the thinner dielectric layer in the grooves can be achieved by use of a chemical deposition or reaction process in which the layer thickness in the grooves is limited by depletion of the source material in the groove. In the case of undercut grooves a line of sight technique such as a spray on source, vacuum evaporation or an ion beam deposition technique is appropriate.

BRIEF DESCRIPTION OF THE DRAWINGS

Embodiments of the invention will now be described, by way of example, with reference to the accompanying drawings in which.

DETAILED DESCRIPTION OF THE EMBODIMENTS

Embodiments of the present invention make use of the geometry of the groove to allow a dielectric layer to be deposited after the groove formation in a way that ensures that at least some regions of the grooves have a substantially thinner layer deposited than the entire top surface. These regions of reduced thickness dielectric within the grooves are then prematurely etched by an appropriate chemical (or other) etchant capable of controllable etching away the dielectric layer. The result is that in these regions the silicon surface can be exposed and able to be plated by the metallization while the top surface of the solar cell remains protected by the dielectric material.

In the above process, the entire groove wall and base does not need to be exposed as only localised areas are sufficient to nucleate plating that will then subsequently facilitate filling the majority of the grooves with the metal. There may in fact be advantages to nucleating the plating only from isolated regions within the groove (which can be facilitated with this approach) as this minimises the overall metal/silicon contact area and therefore reduces the corresponding recombination.

Figure 1:
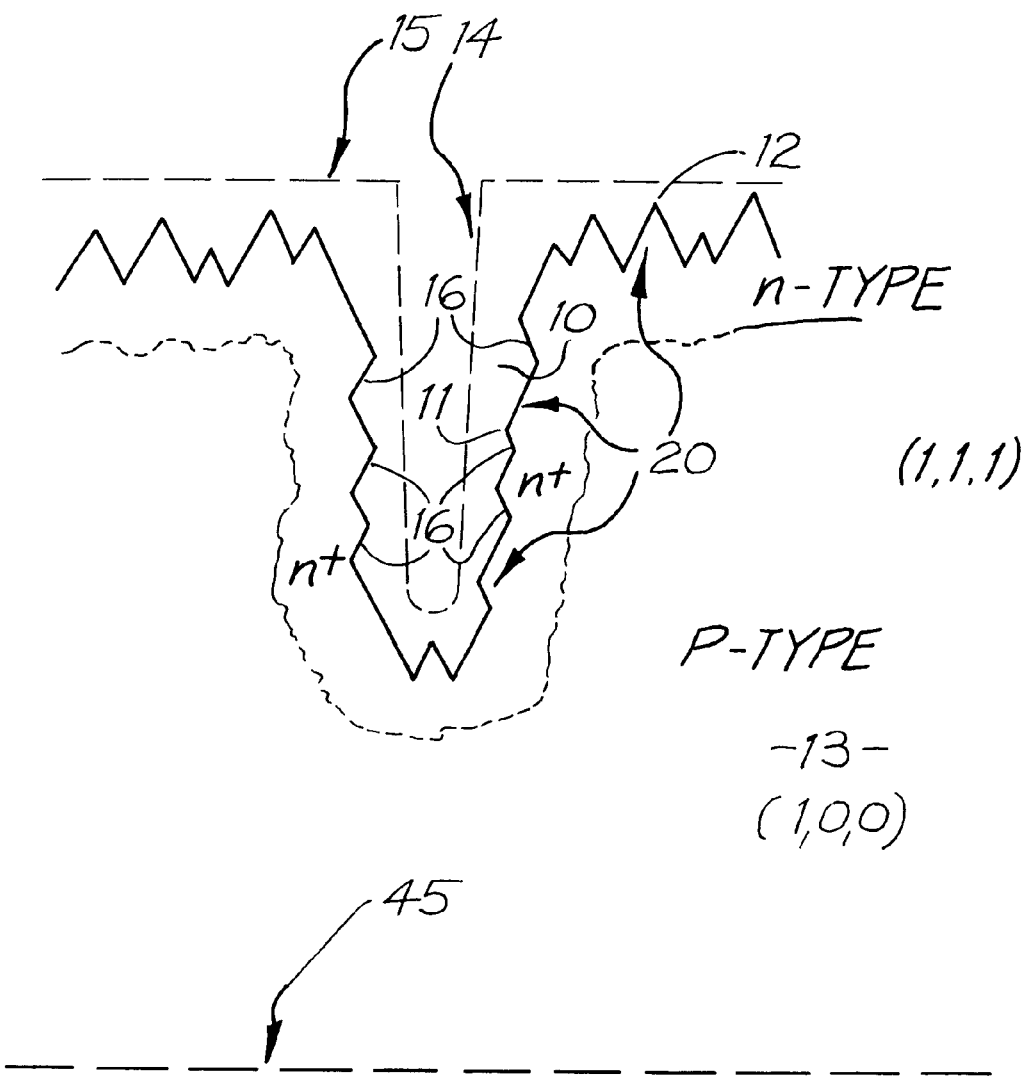
FIG. 1 illustrates a groove in cross section showing undercutting caused by pyramid formations in the groove.

To aid the selectivity of the dielectric layer deposition in terms of differentiation in layer thickness between the top surface and some regions within the grooves, deliberate shading of some regions of the groove can be used. One approach to achieving this is to texture the groove walls 10 so as to produce horizontal pyramids 11 within the groove walls while retaining upright pyramids 12 on the top surface as shown in FIG. 1. This can be achieved by using an appropriate orientation of silicon wafer 13 in conjunction with the use of standard texturing solutions (such as 2% sodium hydroxide with 5% isopropanol at approximately 90° C.) to expose crystal planes 20 (1.1.1) following the scribing of the grooves 14 in the original surface 15. The underneath faces 16 of the horizontal pyramids 11 are then effectively shaded by any line of sight deposition technique for the dielectric layer such as spraying or vacuum evaporation etc. This approach can be used to controllably determine the regions for thinnest dielectric deposition and hence subsequent metal plating.

Figure 2:
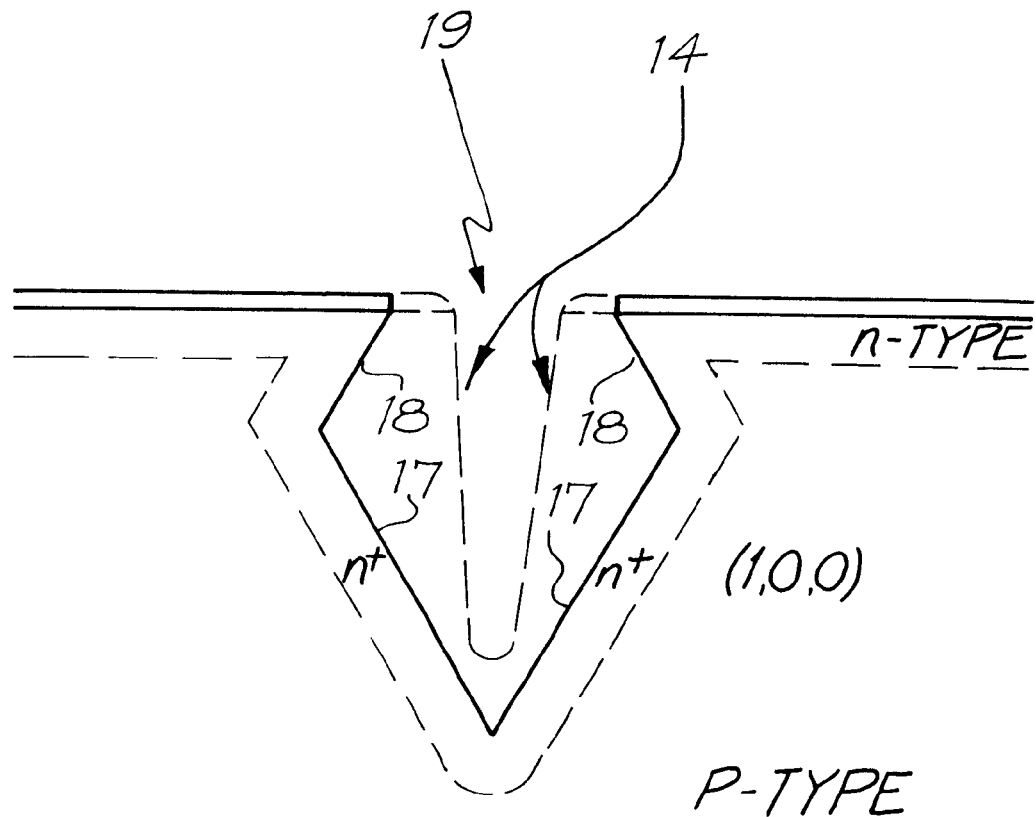
FIG. 2 illustrates a groove in cross section showing re-entrant upper wall portions.
Figure 2:

Referring to FIG. 2, another example of achieving a similar effect, is to form the grooves 9 into the surface so that the grooves are aligned to the crystal axis. Additional etching of the original groove walls can then be used (using an anisotropic etch) to expose the 1-1-1 crystallographic planes 17, 18 of the silicon wafer 13 within the groove 19. The re-entrant exposed planes 18 near the mouth of the grooves 19 are equivalent to the underneath faces 16 of the horizontal pyramids 11 in the FIG. 1 example.

Figure 3:
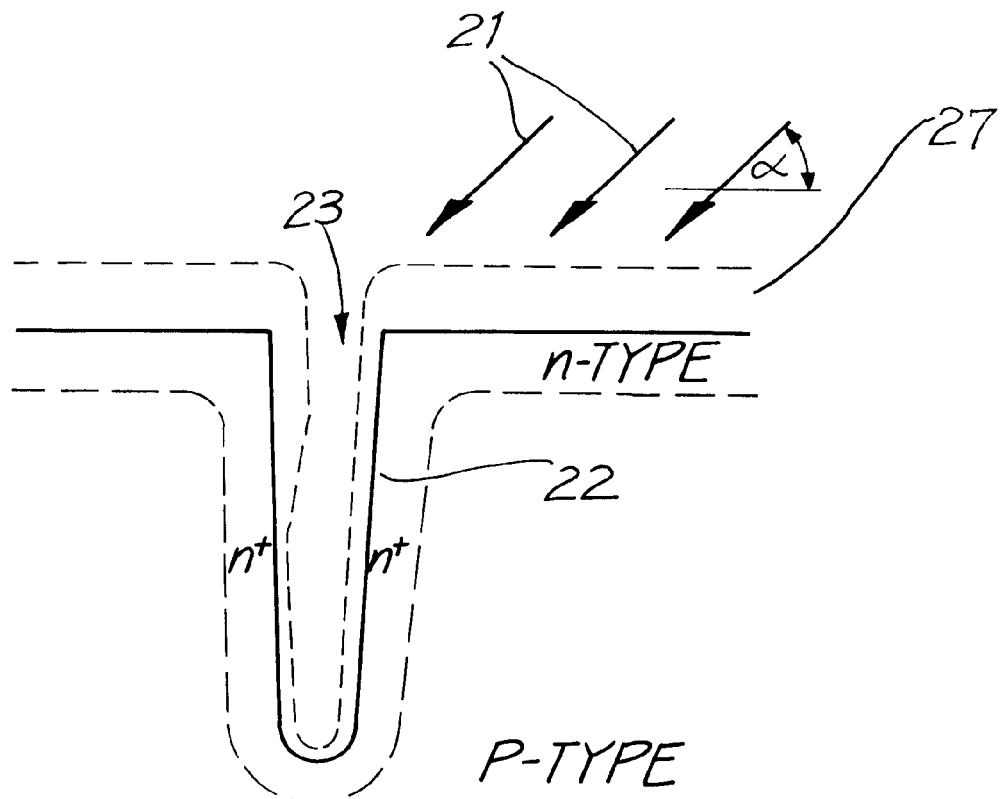
FIG. 3 illustrates deposition of a dielectric layer by an angled directional deposition technique.
Figure 3:

A third example as shown in FIG. 3 is the use of angular deposition 21 (at an angle $\alpha$) of the dielectric layer 27 from the dielectric source to ensure that one side 22 of the groove 23 would be shaded from the deposition, or equivalently grooves can be formed at an angle to the front surface.

Figure 4:
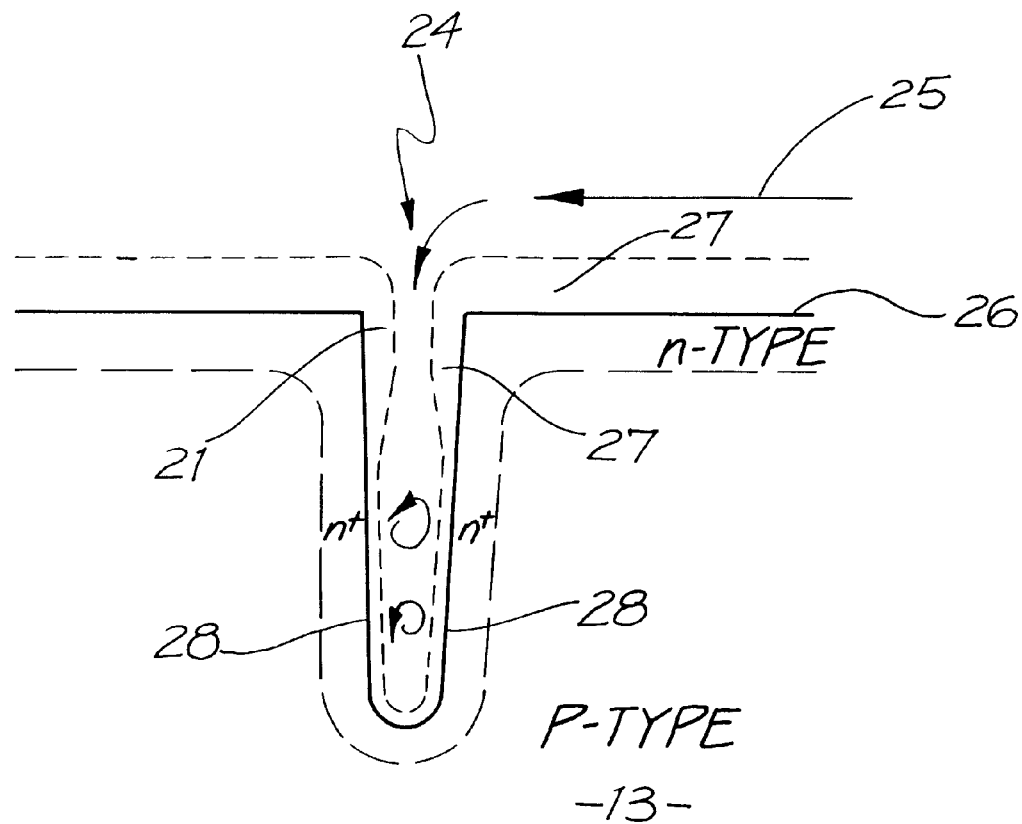
FIG. 4 illustrates deposition of a dielectric by Chemical Vapour Deposition (CVD) with depletion of the source in the grooves.
Figure 4:
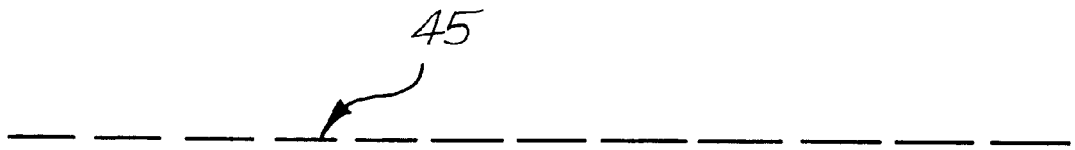

In the examples of FIGS. 2, 3 and 4, top surface texturing has not been shown for simplicity.

Referring to FIG. 4, a fourth approach to achieving the selectivity in the groove region would be to use a dielectric deposition technique whereby the species associated with the dielectric growth or deposition would be naturally depleted within the grooves 24 due to the large surface area relative to the dimensions of the mouth of the grooves. An example would be the chemical vapour deposition of material in which the gas composition, concentration and flow rate are such as to establish a process limited by the diffusion rate of species in the gas thereby determining the deposition rate by the arrival rate at the surface as shown in FIG. 4, where gas flow 25 across the surface 26 limits entry of the gas into the groove 24 thereby causing lower deposition of the dielectric layer 27 on the groove walls 28.

Figure 5:
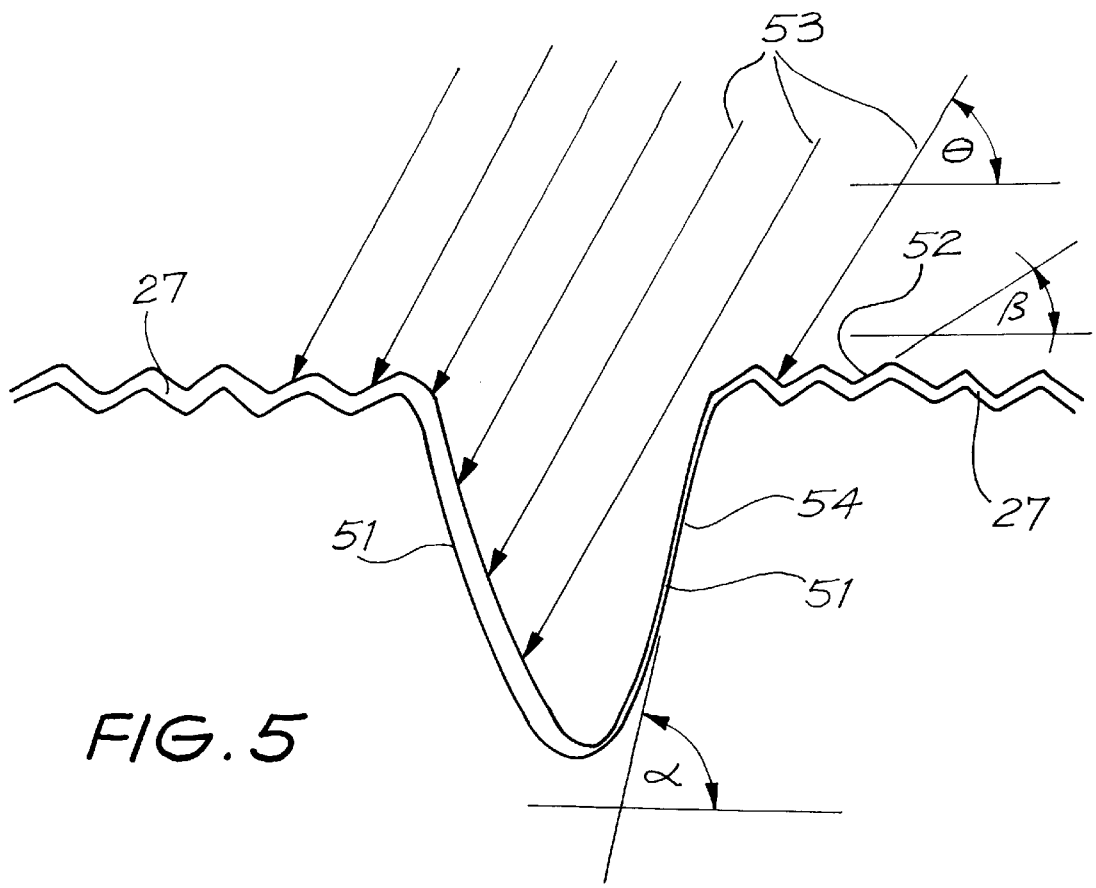
FIG. 5 illustrates deposition of a dielectric layer by another angled deposition technique.

Another method of applying a thinner dielectric layer in at least part of the grooves is illustrated in FIG. 5 where the slope $\alpha$ of at least part of the groove walls 51 is steeper than the steepest slope $\beta$ of the surface texturing 52 (note texturing within the groove has been omitted from FIG. 5 for clarity). Provided that the directional source 53 in the dielectric deposition process is directed at an angle $\theta$ such that $\beta < \theta < \alpha$ then parts 54 of the groove walls 51 will be shaded and have a thinner dielectric layer deposited.

Figure 8:
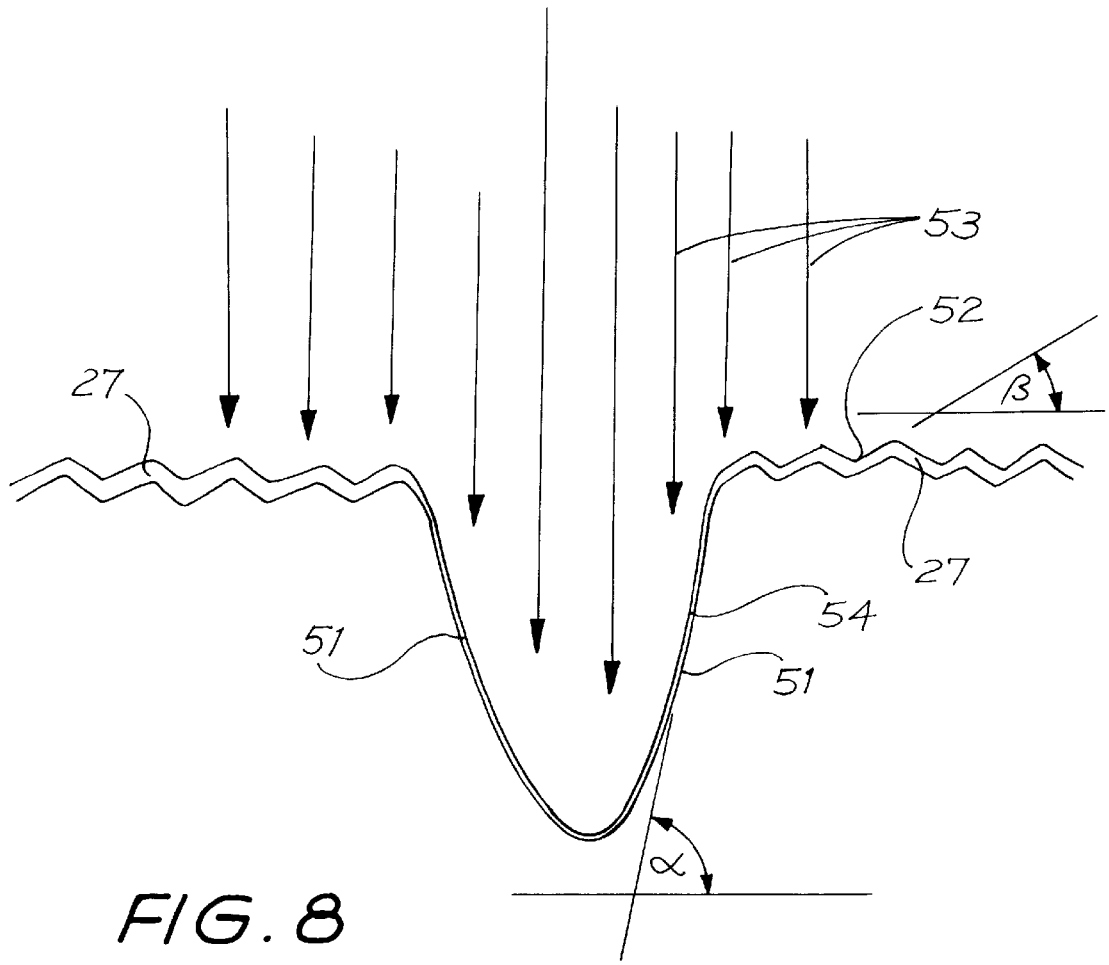
FIG. 8 illustrates a variation on the arrangement of FIG. 5 in which the direction of deposition is perpendicular to the surface of the substrate.

Turning to FIG. 8, a variation on the arrangement of FIG. 5 is illustrated in which the line of sight deposition angle 53 is perpendicular to the surface of the substrate (ie. $\theta > \beta$, $\alpha$). In this instance, both walls of the groove will have a thicker dielectric layer than the wall 54 of FIG. 5 but the dielectric layer in the groove will still be thinner than on the top surface by virtue of the greater slope of the groove walls 51, than the top surface features 52.

Figure 6:
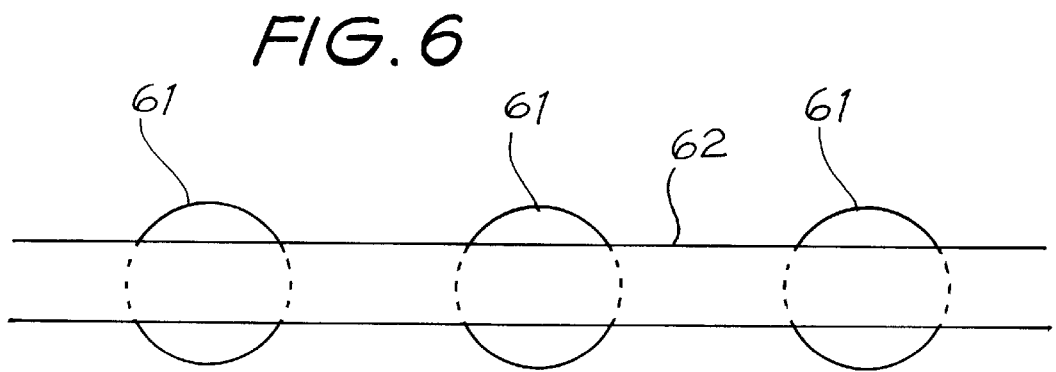
FIG. 6 is a top view of an embodiment employing holes instead of trenches.

In each of FIGS. 1 to 5 and FIGS. 7 and 8, the grooves are illustrated in cross-section with no illustration of their length. Typically these grooves will be a series of long parallel trenches, however, it is not necessary that the grooves be continuous across the surface of the cell and for example in FIG. 6, the grooves could equally be formed as a series of approximately circular holes 61 having width and length of similar dimensions or they could be slots having a length only a few times their width. In the case of discontinuous holes or slots, these would be interconnected by the surface conductors 62 deposited over the surface dielectric layer 63 by screen printing for example.

The advantages provided by the described embodiments of the invention are numerous relative to the previously reported approaches for forming the buried contact solar cell. Firstly, the dielectric layer need not withstand high temperatures nor act as a diffusion mask against unwanted dopants or contaminants increasing both the range of suitable candidates and the range of possible deposition processes. Secondly, the dielectric layer need not be as clean since the risk of contamination of the silicon surface during high temperature processes is removed. Thirdly, the dielectric layer need not withstand the chemical etches used for the groove cleaning and etching. Fourthly, the number of high temperature processes is reduced since the grooves can now be diffused at the same time as the top surface since a dielectric layer across the top surface is no longer required at this stage of the process for subsequent selectivity of the metal plating.

EXAMPLE OF THE IMPLEMENTATION OF THE INVENTION

Figure 7:
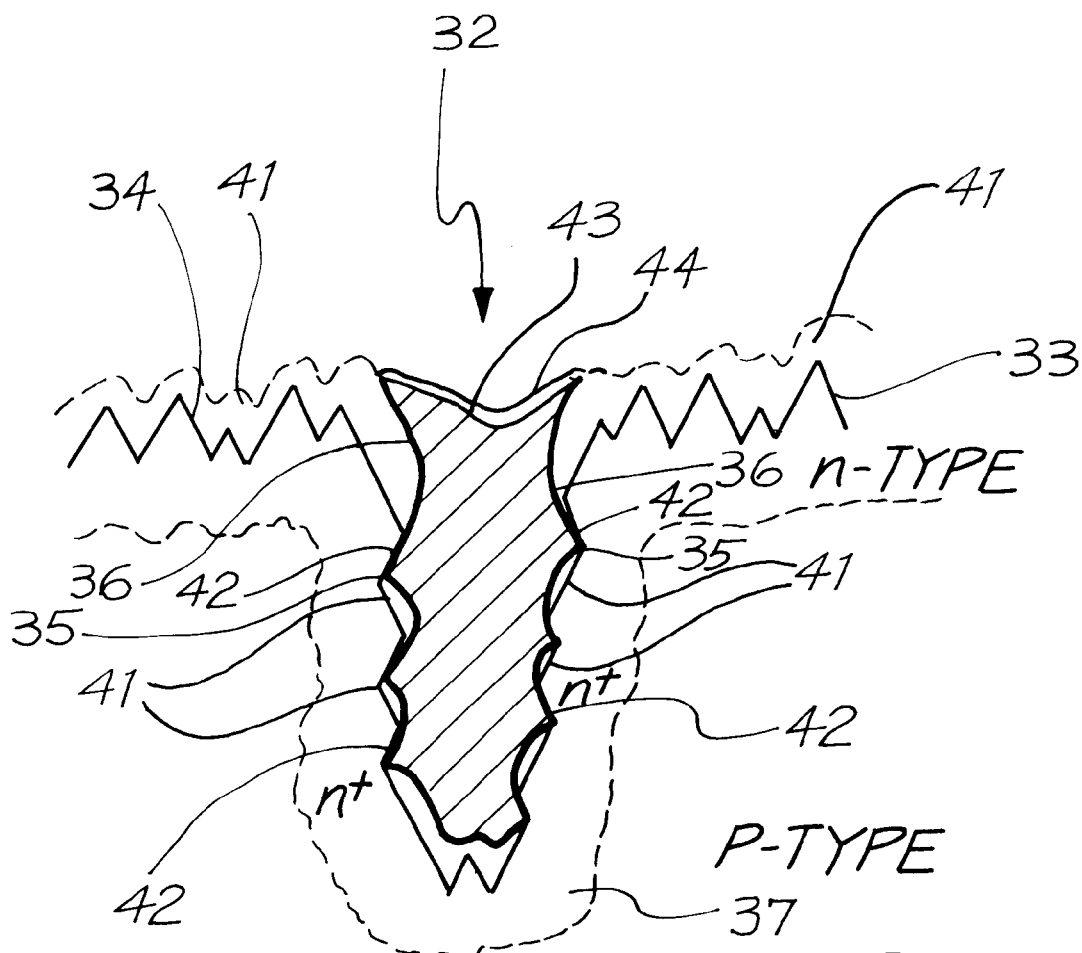
FIG. 7 illustrates a cell after metallization of the groove showing partial removal of the dielectric layer in the groove.
Figure 7:
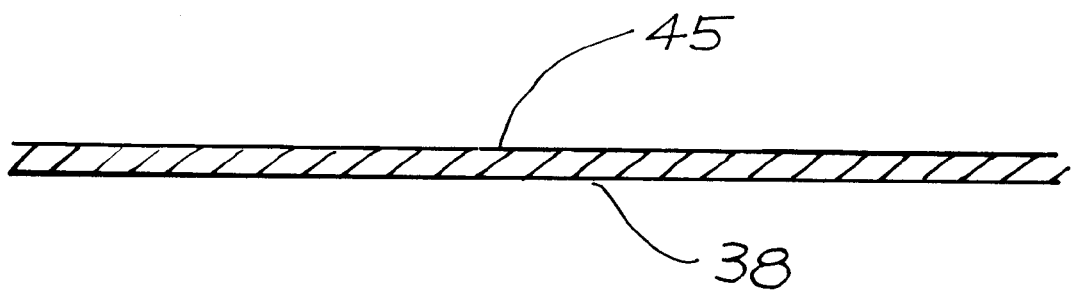

The following process can be applied to a range of commercially available p-type substrates, both single and multicrystalline. FIG. 7 shows a partial product of this process.

1. The "as-cut" or "as-lapped" wafers 31 are grooved 32 on the top surface 33 using a Q-switched neodymium YAG laser operating at 1.06 microns wavelength. The laser power and speed are selected to facilitate the formation of grooves of depth approximately 50 microns, with the pattern formed representing the final design required for the top surface metallization.

2. Provided wafers do not have excessive saw damage (ie, as is the case with wire sawing) the standard texturing etch comprising 2% sodium hydroxide and 5% propanol can be used at 90° C. to simultaneously clean the grooves, remove minor saw damage from the top surface, texture the top surface with upright pyramids 34, and form horizontal pyramids 35 on the groove walls 36. Thorough rinsing of the wafers in deionised water is then followed by immersion in diluted hydrochloric acid prior to additional rinsing and immersion in hydrofluoric acid. Wafers are then again thoroughly rinsed prior to spin drying.

3. Phosphorus diffusion of the top surface is carried out either from a liquid source (with carrier gas carrying the phosphorus compounds into the heated furnace) or solid source. The dopant source or phosphorus glass is deposited at a temperature sufficiently low to prevent significant diffusion of phosphorus into the silicon from taking place. This requires keeping temperatures below 800° C. until a sufficiently thick phosphorus glass layer has been formed on all of the top surface and groove walls to simulate an infinite source (ie, make the subsequent diffusion independent of the thickness of the phosphorus glass layers in all regions. Heating of solid source material ($P_2O_5$) to high temperature at the end of the furnace tube while maintaining the wafers at a temperature below 800° C. is one very effective way of achieving this result.

Liquid spin-on sources can also be used to achieve similar effects and can actually be used to give heavier diffusions within the grooves. This is achieved by diluting the standard commercially available sources with a suitable high purity solvent/liquid such as isopropyl alcohol and then coating, dipping, and/or spinning the wafers so as to leave thicker deposits within the grooves. After drying, a thicker layer with higher phosphorus concentration resides within the regions of the grooves than across the top surface, therefore facilitating heavier phosphorus diffusions in these regions. In this instance the phosphorus glass (if too thick) may have to be removed following the diffusion process to allow a new thin passivating oxide to form during firing of the aluminium contact (the conditions for which can be easily varied accordingly).

Once the phosphorus glass on the surfaces of the groove wall is sufficiently thick the furnace temperature is ramped upwards to increase the cell temperature to approximately 850° C. for 15 minutes, during which time sufficient phosphorus diffuses into the silicon surface to produce an n-type layer 37 with a sheet resistivity in the vicinity of 80 ohms per square. Most diffusion processes will simultaneously lead to the formation of an n-type layer across the rear of the surface 45. This rear junction is later destroyed provided the rear metal contact contains a aluminium or an equivalent material capable of destroying the unwanted junction.

4. The rear metal contact 38 can be applied by screen printing a metallic paste comprising primarily silver powder but with the inclusion of a small percentage of aluminium. The aluminium when sintered at high temperature facilitates good ohmic contact onto the p-type substrate material and will act to simultaneously destroy any unwanted rear junctions. Such screen printing pastes are readily available commercially.

Following the screen printing of the metal paste, the wafer is dried for a period of time at about 250° C. prior to being "fired" at 850° C. in a infrared belt furnace for approximately 30 seconds.

5. Provided the diffusion glass on the wafer surface is not too thick to cause optical problems (ie. greater than about 250 A) the anti-reflection coating can be applied directly onto the wafer top surface while retaining the good surface passivation properties provided by the diffusion oxide (phosphorus glass). The anti-reflection coating can be titanium dioxide with its formation from liquid isopropyl titanate being well documented in the literature. The isopropyl titanate can be sprayed through the use of a compressor and carrier gas onto the heated wafer so that the source is oxidised therefore forming the titanium dioxide layer 41. The chemical resistance and chemical composition of the deposited layer is somewhat dependent on the temperature of the hot plate and the rate of spraying. Hot plate temperatures in the vicinity of 200° C. are commonly used.

6. Prior to electroless plating, the wafer is immersed in concentrated hydrofluoric acid which gradually etches the titanium dioxide. The length of such etching is determined by the time necessary to expose a sufficient area 42 of silicon within the grooves that corresponds to the area required for the metal/silicon contact. Following rinsing, the wafers are electrolessly plated in nickel in commercially available solutions heated to about 90° C. After 2 minutes of plating the wafers are rinsed and dried prior to being sintered at between 350° C. and 400° C. for approximately 10 minutes to enable nickel silicide to be formed. Wafers are then again plated in electroless nickel for 2 minutes prior to plating in electroless copper at approx 50° C. until the grooves are substantially filled with copper 43. Again, the electroless plating solutions are readily available commercially. Following copper plating, the wafers are again rinsed prior to immersion in a solution that deposits a very thin layer of silver 44 on the surface of the copper. This silver is used to improve solderability and protect the copper surface from oxidation and reaction with encapsulants.

7. The final step in the process is for wafers to be edge junction isolated. There are numerous commercial approaches suitable for this purpose. Laser scribing of a groove around the edge of the wafer and also plasma etching of the wafer edges after "coin stacking" the wafers have both been demonstrated successfully.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of processing a semiconductor substrate to produce a metallized buried contact solar cell, comprising the steps of:

forming at least one groove in a substrate surface of the substrate;

simultaneously applying a dielectric coating to the substrate surface and groove walls of said at least one groove so as to produce a thinner dielectric coating on at least regions of the groove walls than a dielectric coating produced on the substrate surface; and simultaneously etching the dielectric coating on the groove walls and the substrate surface until at least parts of the regions of the groove walls are exposed without exposing the substrate surface.

2. The method of claim 1 further comprising the step of forming a buried contact in said at least one groove in the substrate surface.

3. The method of claim 2 further comprising the step of doping the groove walls to form a rectifying junction after the at least one groove is formed but before applying the dielectric coating.

4. The method of claim 3 wherein the doping is achieved using a selective technique whereby a doping level in the at least one groove is higher than a remainder of the substrate surface.

5. The method of claim 4 wherein the doping is achieved by the steps of:
   (a) thinning a spin on dopant with a volatile solvent such that a larger volume of the thinned dopant collects in the grooves;
   (b) gently heating the dopant to drive off the solvent; and
   (c) after the solvent has been driven off, heating the substrate more strongly to drive the dopant into the surface.

6. The method of claim 5 wherein the thinner dielectric layer in the at least one groove is achieved by use of a chemical deposition or reaction process in which a layer thickness in the at least one groove is limited by depletion of source material in the at least one groove.

7. The method according to claim 1, further comprising the step of applying metallization to the at least one groove after the thinner dielectric coating has been etched back to produce the regions of the groove walls that are exposed.

8. A method of processing a semiconductor substrate to produce a metallized buried contact solar cell, comprising the steps of:
   forming at least one groove in a substrate surface of the substrate;
   forming undercut regions in groove walls of the at least one groove;
   simultaneously applying a dielectric coating to the substrate surface and the at least one groove by a line of sight deposition technique such that a thinner dielectric coating is formed on at least the undercut regions than a dielectric coating that is formed on the substrate surface; and
   simultaneously etching the dielectric coating on the groove walls and the substrate surface until at least parts of the undercut regions of the groove walls are exposed without exposing the substrate surface.

9. The method of claim 8 further comprising the step of forming a buried contact in said at least one groove in the substrate surface.

10. The method of claim 9 further comprising the step of doping the groove walls to form a rectifying junction after the at least one groove is formed but before applying the dielectric coating.

11. The method of claim 10 wherein the doping is achieved using a selective technique whereby a doping level in the at least one groove is higher than a remainder of the substrate surface.

12. The method of claim 11 wherein the doping is achieved by the steps of:
   (a) thinning a spin on dopant with a volatile solvent such that a larger volume of the thinned dopant collects in the grooves;
   (b) gently heating the dopant to drive off the solvent; and
   (c) after the solvent has been driven off, heating the substrate more strongly to drive the dopant into the surface.

13. The method of claim 8 wherein the line of sight technique employs a step of spraying on a dielectric source of dopant ions.

14. The method of claim 8 wherein the line of sight technique employs a step of vacuum evaporation and deposition of a dielectric source.

15. The method of claim 8 wherein the line of sight technique employs a step of depositing a dielectric source using an ion beam deposition technique.

16. The method according to claim 8, further comprising the step of applying metallization to the at least one groove after the thinner dielectric coating has been etched back to produce the regions of the groove walls that are exposed.

17. A method of processing a semiconductor substrate, to produce a solar cell, having a substrate surface which has surface texturing in which surface features have a slope less steep do or of equal steepness to a maximum slope value, the method comprising the steps of:
   forming at least one groove in the substrate surface having at least portions of groove walls which slope at a slope which is more steep than the maximum slope value of the surface features of the surface texturing;
   simultaneously applying a dielectric coating to the substrate surface and the at least one groove by a line of sight deposition technique such that a thinner dielectric coating is formed on regions of the groove walls than a dielectric coating that is formed on the substrate surface; and
   simultaneously etching the dielectric coating on the groove walls and the substrate surface until at least parts of the regions of the groove walls are exposed without exposing the substrate surface.

18. The method of claim 17 further comprising the step of forming a buried contact in said at least one groove in the substrate surface.

19. The method of claim 18 further comprising the step of doping the groove walls to form a rectifying junction after the at least one groove is formed but before applying the dielectric coating.

20. The method of claim 19 wherein the doping is achieved using a selective technique whereby a doping level in the at least one groove is higher than a remainder of the substrate surface.

21. The method of claim 20 wherein the doping is achieved by the steps of:
   (a) thinning a spin on dopant with a volatile solvent such that a larger volume of the thinned dopant collects in the grooves;
   (b) gently heating the dopant to drive off the solvent; and
   (c) after the solvent has been driven off, heating the substrate more strongly to drive the dopant into the surface.

22. The method of claim 17 wherein an angle of deposition in the line of sight deposition technique is less steep than a slope of at least part of the groove walls.

23. The method of claim 22 wherein the angle of deposition is steeper than the maximum slope of the surface features.

24. The method of claim 17 wherein the line of sight technique employs a step of spraying on a dielectric source of dopant ions.

25. The method of claim 17 wherein the line of sight technique employs a step of vacuum evaporation and deposition of a dielectric source.

26. The method of claim 17 wherein the line of sight technique employs a step of depositing a dielectric source using an ion beam deposition technique.

27. The method according to claim 17, further comprising the step of applying metallization to the at least one groove after the thinner dielectric coating has been etched back to produce the regions of the groove walls that are exposed.

28. The method according to claim 1 wherein a length of the at least one groove is of the same order of magnitude as a width of the at least one groove and said at least one groove includes adjacent grooves that are connected by a surface contact.

29. The method according to claim 8 wherein a length of the at least one groove is of the same order of magnitude as a width of the at least one groove and said at least one groove includes adjacent grooves that are connected by a surface contact.

30. The method according to claim 17 wherein a length of the at least one groove is of the same order of magnitude as a width of the at least one groove and said at least one groove includes adjacent grooves that are connected by a surface contact.

31. The method according to claim 1 wherein the at least one groove forms part of a semiconductor device formed on the semiconductor substrate.

32. The method according to claim 8 wherein the at least one groove forms part of a semiconductor device formed on the semiconductor substrate.

33. The method according to claim 17 wherein the at least one groove forms part of a semiconductor device formed on the semiconductor substrate.

34. A method of processing a semiconductor substrate, to produce a solar cell, having a substrate surface which has no surface texturing, the method comprising the steps of:

forming at least one groove in the substrate surface having regions of groove walls which slope at a slope which is more steep than predetermined slope value;

simultaneously applying a dielectric coating to the substrate surface and the at least one groove by a line of sight deposition technique along an axis having a slope which is less steep than the predetermined slope value whereby a thinner dielectric coating is formed on the regions of the groove walls than a dielectric coating that is formed on the substrate surface; and simultaneously etching the dielectric coating on the groove walls and the substrate surface until at least parts of the regions of the groove walls are exposed without exposing the substrate surface.

35. The method of claim 34 further comprising the step of forming a buried contact in said at least one groove in the substrate surface.

36. The method of claim 35 further comprising the step of doping the substrate surface and the groove walls to form a rectifying junction after the at least one groove is formed but before applying the dielectric coating.

37. The method of claim 36 wherein the doping is achieved using a selective technique whereby a doping level in the at least one groove is higher than a remainder of the substrate surface.

38. The method of claim 37 wherein the doping is achieved by the steps of:

(a) thinning a spin on dopant with a volatile solvent such that a larger volume of the thinned dopant collects in the grooves;

(b) gently heating the dopant to drive off the solvent; and (c) after the solvent has been driven off, heating the substrate more strongly to drive the dopant into the surface.

39. The method of claim 34 wherein an angle of deposition in the line of sight deposition technique is less steep than a slope of at least part of the groove walls.

40. The method of claim 39 wherein the substrate surface includes surface features and the angle of deposition is steeper than a maximum angle of the surface features.

41. The method of claim 34 wherein the line of sight technique employs a step of spraying on a dielectric source of dopant ions.

42. The method of claim 34 wherein the line of sight technique employs a step of vacuum evaporation and deposition of a dielectric source.

43. The method of claim 34 wherein the line of sight technique employs a step of depositing a dielectric source using an ion beam deposition technique.

44. The method according to claim 34 wherein a length of the at least one groove is of the same order of magnitude as a width of the at least one groove and said at least one groove includes adjacent grooves that are connected by a surface contact.

45. The method according claim 34 wherein the at least one groove forms part of a semiconductor device formed on the semiconductor substrate.

46. The method of claim 34, including the step of applying metallization to the grooves after the dielectric has been etched back to expose at least part of the groove walls.

47. The method according to claim 34, further comprising the step of applying metallization to the at least one groove after the thinner dielectric coating has been etched back to produce the regions of the groove walls that are exposed.

* * * * *